(12) United States Patent
Li et al.

(10) Patent No.: US 10,381,526 B2
(45) Date of Patent: Aug. 13, 2019

(54) ORDERLY PATTERNED REMOTE PHOSPHOR CRYSTAL MATERIAL AND METHOD FOR PREPARATION THE MATERIAL AND ITS APPLICATION

(71) Applicant: XI'AN JIAOTONG UNIVERSITY, Xi'an, Shaanxi (CN)

(72) Inventors: Yufeng Li, Shaanxi (CN); Shuai Wang, Shaanxi (CN); Feng Yun, Westford, MA (US)

(73) Assignee: XI'AN JIAOTONG UNIVERSITY, Xi'an, Shaanxi (CN)

( * ) Notice: Subject to any disclaimer, the term of this patent is extended or adjusted under 35 U.S.C. 154(b) by 66 days.

(21) Appl. No.: 15/502,204

(22) PCT Filed: Jan. 13, 2016

(86) PCT No.: PCT/CN2016/070742
§ 371 (c)(1),
(2) Date: Feb. 7, 2017

(87) PCT Pub. No.: WO2017/080107
PCT Pub. Date: May 18, 2017

(65) Prior Publication Data
US 2018/0240943 A1      Aug. 23, 2018

(30) Foreign Application Priority Data
Nov. 12, 2015  (CN) .......................... 2015 1 0771309

(51) Int. Cl.
*H01L 21/00*    (2006.01)
*H01L 33/50*    (2010.01)
*C30B 29/28*    (2006.01)
*C09K 11/77*    (2006.01)
*C30B 29/10*    (2006.01)

(52) U.S. Cl.
CPC ........ *H01L 33/502* (2013.01); *C09K 11/7774* (2013.01); *C30B 29/10* (2013.01); *C30B 29/28* (2013.01); *H01L 2933/0041* (2013.01)

(58) Field of Classification Search
CPC ................... H01L 33/502; H01L 33/50; H01L 2933/0041; C30B 29/28; C30B 29/10
See application file for complete search history.

(56) References Cited

U.S. PATENT DOCUMENTS

2014/0001156 A1* 1/2014 Piquette ................ H01L 33/508
                                                                    216/99
2014/0120699 A1* 5/2014 Hua .................. H01L 21/02076
                                                                    438/463

FOREIGN PATENT DOCUMENTS

CN            103864070 A    *  6/2014

* cited by examiner

*Primary Examiner* — Richard A Booth

(57) ABSTRACT

The present invention provide an orderly patterned remote phosphor crystal material and method for preparation the material and its application, which adopts short-pulse laser to make micro-structure arrays on the surface of phosphor crystal material to enhance the light extraction efficiency of the LED based on the material. The present invention overcomes the phosphor crystal material's properties of hard and dry/wet etching resistance and simplifies the processing steps, which accelerate the processing and improve the producing efficiency. The present invention is able to be performed under room temperature and environment friendly and the micro-structure is stable, which has broad application prospects in white LED field.

5 Claims, 5 Drawing Sheets

ORDERLY PATTERNED REMOTE PHOSPHOR CRYSTAL MATERIAL AND METHOD FOR PREPARATION THE MATERIAL AND ITS APPLICATION

CROSS REFERENCE OF RELATED APPLICATION

This is a U.S. National Stage under 35 U.S.C 371 of the International Application PCT/CN2016/070742, filed Jan. 13, 2016, which claims priority under 35 U.S.C. 119(a-d) to CN 201510771309.5, filed Nov. 12, 2015;

BACKGROUND OF THE PRESENT INVENTION

Field of Invention

The present invention relates to improvement of luminous efficacy and performance of white LED, green LED, yellow LED and red LED which adopt remote phosphor structure design, and more particularly to a method to improve the light extraction efficiency of the material by processing the remote phosphor crystal material with laser.

Description of Related Arts

Compare with the conventional lighting fixture such as incandescent lamp and fluorescent lamp, LED (Light emitting diode) has the advantage of small power consumption, high luminous efficacy, long lifespan, energy saving and environment-friendly, and is widely applied in fields such as daily illumination. Conventionally, blue LED chip excite Ce:YAG ($Y_3Al_5O_{12}$) phosphor and emit yellow light and this yellow emission combine with the remaining blue emission gives the "white" light. The conventional encapsulation of the phosphor is to spray or spin coating the mixture of phosphor (0.1 μm-100 μm) and silicone or epoxy on the blue LED chip. The disadvantages of the conventional technology are: (1) the phosphor is very close to the chip and the generated heat pass through the LED chip, which enhance the chip's temperature and shortened the service life of the white LED; (2) Due to the limitation of the uncertainty caused by spay and spin coating techniques the thickness and density of the phosphor on the same LED chip may differ, which cause the difference on correlated color temperature, luminescence characteristics etc. and have bad effects on product yield; (3) the interface of YAG particles and the carrier (silicone, epoxy or SOG) is able to cause scattering. The difference of the refractive index of the contact surface material of the interface (scattering center) decides the scattering intensity. When coating the combined micro particle and carrier material on the LED chip, nearly half of the light is scattered and only small part of light is able to emit from the chip surface. The scattered light is absorbed by the chip and encapsulation material and dissipated. The light is also scattered on the border between the YAG particles and same problem arise if adopts ceramic platelet which is directly made by pressing phosphor particles together through high temperature and high pressure. The single crystal or polycrystalline Ce:YAG phosphor crystal material is suitable to be a replacement of the above mentioned phosphor material and compensate the disadvantages to a great extent[Laser & Photonics Reviews, Vol. 8, No. 1, 158-164(2014)]. The single crystal or polycrystalline Ce:YAG has a fewer scattering centers than the conventional phosphor powder and phosphor ceramic platelet and furthermore the single crystal has less scattering than polycrystal. Compared to the conventional phosphor particles the transparent single crystal or polycrystalline Ce:YAG has the advantage of high excitation and emission rate, stable while being heated, high thermal conductivity, good mechanical strength etc. The travel of the light in the single crystal or polycrystalline Ce:YAG is limited by the total internal reflection and the critical angle. Due to the refractive index of the Ce:YAG (~1.82) is differ greatly with the air's refractive index, the light with an incident angle over 33.1° is totally reflected back at the interface of the YAG and air and is not able to be emitted out of the surface of the crystal which causes light loss and increase the heat of YAG material. The illumination efficacy of the white LED is thus affected. A simple and effective method is needed to change the light extraction feature of the single crystal and polycrystalline material.

Conventionally, the methods for improve the light extraction efficiency of the white LED using Ce:YAG phosphor crystal includes: 1) unevenly coarsens the surface of the material; Direct coarsening the ceramic surface by adopting the method of wet chemical etching; the rough surface is able to change the scattering angle of the photon inside the ceramic and increase the probability of the photons escaping from the Ce:YAG ceramic. Alan Piquette et al. proposed a method for wet etching a ceramic phosphor converter (Osram Sylvania Inc. Patent US20140001156 A1), which adopts boiled mixture of sulfuric ($H_2SO_4$) and phosphoric ($H_3PO_4$) acids to etch the surface of the ceramic phosphor converter; Coarsening the surface by etching it into the grain structure to increase overall lumen output and increase forward lumen output of the white LED. Because Ce:YAG crystal is acid and alkali corrosion resistant, which makes the etching process in the method goes slowly and very time consuming. The required condition for etching is very harsh to meet. The production cost is high and this method is not able to applied in mass production. 2) Deposits other material (such as $SiO_2$, $TiO_2$, SiNx) on the YAG material by physical or chemical method, and then patterning the material into micro/nano structures to form a layer of periodic micro/nano structures material on the surface of the Ce:YAG phosphor ceramic, which is able to increase light emitting. For example the micro/nano structures of polystyrene, $TiO_2$, SiNx etc. is deposited on the surface of Ce:YAG ceramic crystal to improve the light emitting efficiency [Optics Express, Vol. 19, No. 25, 25593 (2011); Optics Letters, Vol. 38, No. 15, 2796 (2013); Nanotechnology, 24 (2013) 085302; Journal of Materials Chemistry C, 1 (2013) 1732; Journal of Materials Chemistry C, 2 (2014) 7513]. The method requires techniques such as adding nanosphere mask, metal evaporation, dry etching, the procedure of which is complicated and the cost is high. The micro/nano structures are easy to break, detach from the surface of the phosphor ceramic and is unstable under the influence of external environment (such as high temperature, humidity, PH value and etc.). The service lifespan of the structures is limited.

SUMMARY OF THE PRESENT INVENTION

An object of the present invention is to provide an orderly patterned remote phosphor crystal material and the method for preparation and its application.

Accordingly, in order to accomplish the above objects, the present invention provides an orderly patterned remote phosphor crystal material comprising: a remote phosphor crystal material body, micro-structure arrays on the surface of the remote phosphor crystal material body which are made by laser ablation.

The micro-structure arrays are periodically arranged holes with a diameter of 5 μm-30 μm, a depth of 1 μm-5 μm and a space between adjacent holes of 5 μm-50 μm.

The remote phosphor crystal material body is made by $Lu_3Al_5O_{12}:Ce$, $Tb_3Al_5O_{12}:Ce$, $Y_3Al_5O_{12}:Ce$, $(LuY)_3Al_5O_{12}:Ce$, $Y_3(Al,Ga)_5O_{12}$, Ce, $Y_3(Al,Si)_5(O,N)_{12}:Ce$.

1. A method for making the orderly patterned remote phosphor crystal material, as recited in claim 1, comprising the following steps, wherein:
1) placing the remote phosphor crystal material ready for processing on a stage which is able to move freely along 2-dimensionally horizontal directions and focusing a short-pulse laser on a surface or above the surface of the remote phosphor crystal material ready for processing;
2) Moving the stage which carries the remote phosphor crystal material and point-by-point scanning the surface of the remote phosphor crystal material with short-pulse laser, which forms micro-structure arrays on the surface of the remote phosphor crystal material.

The shape, size and spacing of a single structure in the micro-structure arrays is combinedly controlled by the power of pulsed laser, repetition frequency of the pulse laser, the spacing between the laser focal plane and the surface of the material and the moving speed of the stage.

A pulse-width of the short-pulse laser is 20 fs-100 ns; a wavelength is 355 nm-800 nm, a repetition frequency is 10 Hz-170 kHz; a laser power is 0.001 W-0.5 W; an energy density threshold of the laser is 30 $J/cm^2$-50 $J/cm^2$; a moving speed of the stage is 1 mm/s-100 mm/s.

The method is also comprising the following step; after finishing the step 2), dipping the remote phosphor crystal material with micro-structure arrays on the surface into a mixed acids of concentrated sulfuric acid and hydrogen peroxide or into concentrated sulfuric acid to remove debris generated by laser ablation; wherein a volume ratio of the concentrated sulfuric acid and hydrogen peroxide is 3:1-7:1.

The remote phosphor crystal material ready for processing is made of $Y_3Al_5O_{12}:Ce$ with a thickness of 0.1 mm-5 mm; case one: a pulse width of the short-pulse laser is 1 ns-100 ns; a wavelength is 300 nm-400 nm; a repetition frequency is 1 kHz-30 kHz; a laser power is 0.01 W-0.5 W; a diameter of focused spot is 20 μm; a moving speed of the stage is 1 mm/s-100 mm/s. Or case two: a pulse width of the short-pulse laser is 20 ns-200 ns; a wavelength is 355 nm-800 nm; a repetition frequency is 10 Hz-100 kHz; a laser power is 0.01 W-0.5 W; a diameter of focused spot is 20 μm; a moving speed of the stage is 1 mm/s-100 mm/s.

An absorption peak of the phosphor crystal material of $Y_3Al_5O_{12}:Ce$ is 420-460 nm; an emission peak is 510-570 nm; a doping concentration of $Ce^{3+}$ in $Y_3Al_5O_{12}:Ce$ is 0.01-1 at % (atomic fraction).

The orderly patterned remote phosphor crystal material is applied in enhancing light extraction efficiency of LED light emitting device.

The light emitting device adopts blue LED chip or ultraviolet LED chip; a peak wavelength of emitted light is 440 nm-460 nm or 300 nm-380 nm.

Therefore the advantages of the technical solution are as below:
1. Applying the patterned structure on the crystal surface is able to enhances the conversion efficiency and luminous efficacy of the LED under the same current input and makes more photons emit out from the surface of phosphor crystal material, which enhances the front/side light emitting ratio of the LED;
2. The processing of the micro-structure arrays on the surface of the phosphor crystal material is rapid and with high efficiency. Take the micro-hole with the spacing of 10 μm for example, within one hour 700 LED chips (250×572 μm) are able to be processed covered with phosphor crystal with large scale micro-hole arrays. The present invention solves the problem of high cost and low efficiency in conventional processing method. The present invention is under low temperature and environment friendly, which is easy to implement with simple processing procedure and has wide application prospect in LED field;
3. The size and spacing of the micro-structure arrays on the surface of phosphor crystal material is controllable. Large scale orderly micro-hole arrays are able to be prepared;
4. The patterned structure arrays inherit the features of the crystal material which has stable physical and chemical characters and is anti-oxidation, anti-radiation, with high mechanical strength and stable.

DETAILED DESCRIPTION OF THE PREFERRED EMBODIMENT

Figure 1:
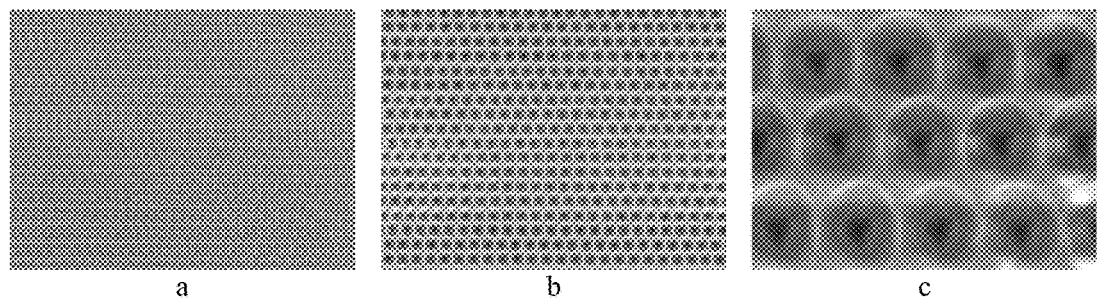
FIG. 1 is the SEM (scanning electron microscope) of a Ce:YAG phosphor crystal material with micro-hole arrays processed by laser in the embodiments. The spacing between the micro-hole is 10 μm. The diameter of every micro-hole is 7.5 μm and the depth of the micro-hole is 3 μm. (a) is the SEM taken at 300 times magnification, (b) is the SEM taken at 1200 times magnification, (c) is the SEM taken at 7000 times magnification.
Figure 2:
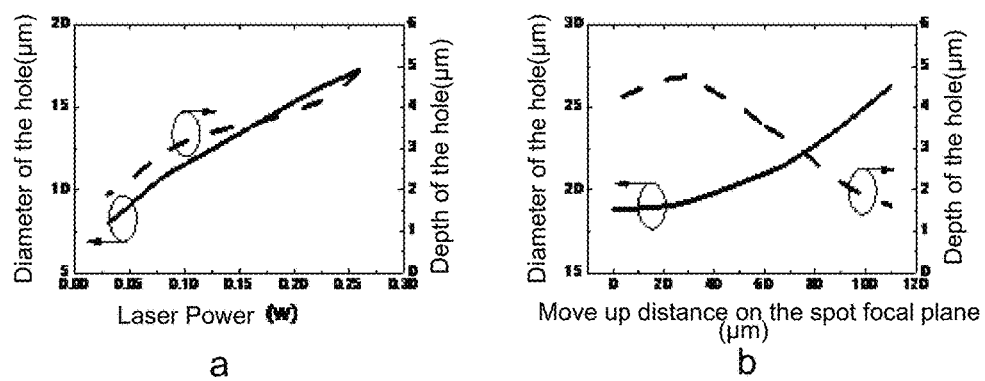
FIG. 2 illustrates the dependence of the size (diameter and depth) of micro-hole on 355 nm short-pulse laser power (a), and on moving-up distance of the light spot focal plane (b).

Referring to FIG. 1 to FIG. 7 of the drawings, preferred embodiments of the present invention are illustrated, wherein the present invention provides a simple and highly effective method to pattern the surface of single crystal and polycrystalline transparent phosphor crystal material, which is able to reduce the total internal reflection of the light inside the phosphor crystal material to improve the light extraction efficiency of the LED chip and the phosphor crystal material and enhance the LED luminous efficacy (1 m/W). The present invention proposes that the patterned single crystal or polycrystalline material is a replacement for phosphor powder that under same excitation of LED chip higher conversion efficiency (1 m/W) will be obtained. The present invention has the advantages of good optical uniformity, high brightness, simplified encapsulation techniques, excellent thermostability, long service lifespan, simple structure and good performance which is particularly suitable for high-power white LED device.

The phosphor crystal material is able to be $Lu_3Al_5O_{12}$:Ce, $Tb_3Al_5O_{12}$:Ce, $Y_3Al_5O_{12}$:Ce, $(LuY)_3Al_5O_{12}$:Ce, $Y_3(Al,Ga)_5O_{12}$:Ce or $Y_3(Al,Si)_5(O,N)_{12}$:Ce.

The method is also suitable for other phosphor material that involves transparent single crystal, polycrystalline YAG phosphor crystal material include but not limited to yellow Ce:YAG ($Y_3Al_5O_{12}$ mixed with $Ce^{3+}$) transparent phosphor material. Furthermore the rare earth luminescent ions Tb, Pr, Eu, Nd, Tm, Dy is able to be doped or codoped in YAG material to modulate the wavelength. The doping substrates include but not limited to $Y_2O_3$, LuAG, $Lu_2O_3$, $Sc_2O_3$, $MgAl_2O_4$, $CaF_2$, ZnS. Under the excitation of LED chip single or multiple wavelengths light is able to be emitted.

Take $Y_3Al_5O_{12}$:Ce as an example, blue LED chip or ultraviolet LED excite the transparent YAG material to emit yellow light which is mixed with the emitting light of the blue LED chip or ultraviolet LED chip to form white light. A simple method to enhance the light extraction efficiency of the Ce:YAG phosphor crystal material for white LED is proposed that is to make micro-structure arrays on the surface of Ce:YAG phosphor crystal material directly by short-pulse laser to enhance the light extraction efficiency of the Ce:YAG phosphor crystal material for white LED. The short-pulse laser refers to the laser that reaches a certain energy density (in the present invention the energy density threshold of the laser is 30-50 $J/cm^2$, the energy density threshold may varies for laser with different wavelength.), the pulse width is 1-100 fs to 1-100 ns, the wavelength is 355 nm to 800 nm (for example 355 nm or the UV laser with a wavelength less than 400 nm or other laser with long wavelength).

Embodiment 1

The Implement Steps are as Follow:

Step 1: place the Ce:YAG phosphor single crystal material with a thickness of 0.3 mm ready for processing on the stage which is able to move freely along 2-dimensionally horizontal directions. The short-pulse laser focuses on one side of the phosphor crystal material through objective;

In step 1 the Ce:YAG phosphor material is double face polished. The absorption peak and the emission peak of the Ce:YAG phosphor material are 450 nm and 550 nm respectively; The doping concentration of the Ce in the Ce:YAG phosphor material is 0.03 at %; The pulse width, wavelength and repetition frequency of the short-pulse laser are 40 ns, 355 nm and 1 kHz respectively. The moving speed of the stage is 10 nm/s. The power of the short-pulse laser is 0.15 W and the laser spot focuses on the surface of the material (the diameter of the spot is 20 μm).

Step 2: Due to the special processing character of the laser, an ablation area is formed on the surface of the Ce:YAG phosphor crystal material around an area that takes the laser focus as the center that the peak energy of the generated pulse is especially high. The temperature on the focus rises rapidly and reaches the boiling point of the YAG material in a short time, then evaporate the material on the focus. The evaporated material is taken away by high speed and high pressure gas sprayed by the nozzle and a hole is formed on the surface. Moving the stage carried with the material under the control of computer software to form the micro-structure arrays on one side of Ce:YAG phosphor crystal material. Please refer to FIG. 1

By adjusting the output power of the laser and the distance between the focal plane and the Ce:YAG phosphor crystal material, the micro-structure arrays with different diameter and depth are able to be formed. Refers to FIG. 2, with the gradually increase of the laser power the diameter of a single micro-structure is increased from 6 μm to 17 μm and the depth increased from 1.5 μm to 5 μm; With the gradually increase of the distance between the spot focal plane and material the diameter of a single micro-structure is increased from 18 μm to 26 μm and the depth decreased from 5 μm to 1.5 μm. By adjusting the repetition frequency of the laser and the moving speed of the stage the distribution period and spacing of between the micro-structure is able to be changed; By adjusting the scan trace the micro-structure arrays is able to form different patterns.

Step 3: Put the processed Ce:YAG phosphor crystal material in the mixed acids (volume to volume ratio is 3:1) of concentrated sulfuric acid (mass fraction: 98%) and hydrogen peroxide (mass fraction: 30%) for half an hour. The appearance of the Ce:YAG phosphor crystal material surface change slightly before and after the purge of the mixed acid while the depth of the micro-hole increase a little bit. The main purpose for the purge is to clean the residual debris of the laser ablation on the surface (This step is not a must which is to purge the residual debris of the ablation and make the micro-hole smooth. The micro-structure is formed by the short-pulse laser). Purge the remaining acid with ionized water before blow-drying with nitrogen and get the patterned Ce:YAG phosphor crystal material. Longer purge time is needed when using the concentrated sulfuric acid. The purge process is able to be accelerated by heating.

Figure 3:
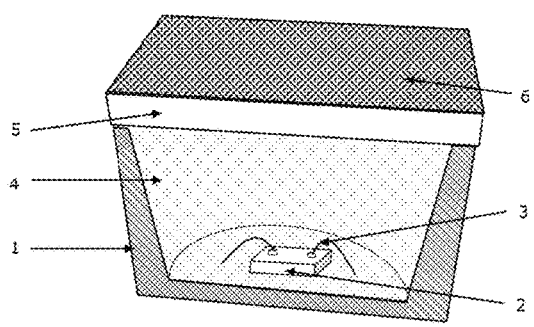
FIG. 3 is an illustration of applying the Ce:YAG phosphor crystal material in white LED encapsulation structure; 1 is the encapsulation substrate of LED; 2 is the blue LED chip; 3 is the electrode lead; 4 is the filling materials (silicon, epoxy or air); 5 is Ce:YAG phosphor crystal material; 6 is micro-hole arrays on the surface of Ce:YAG phosphor to crystal material processed by laser.
Figure 4:
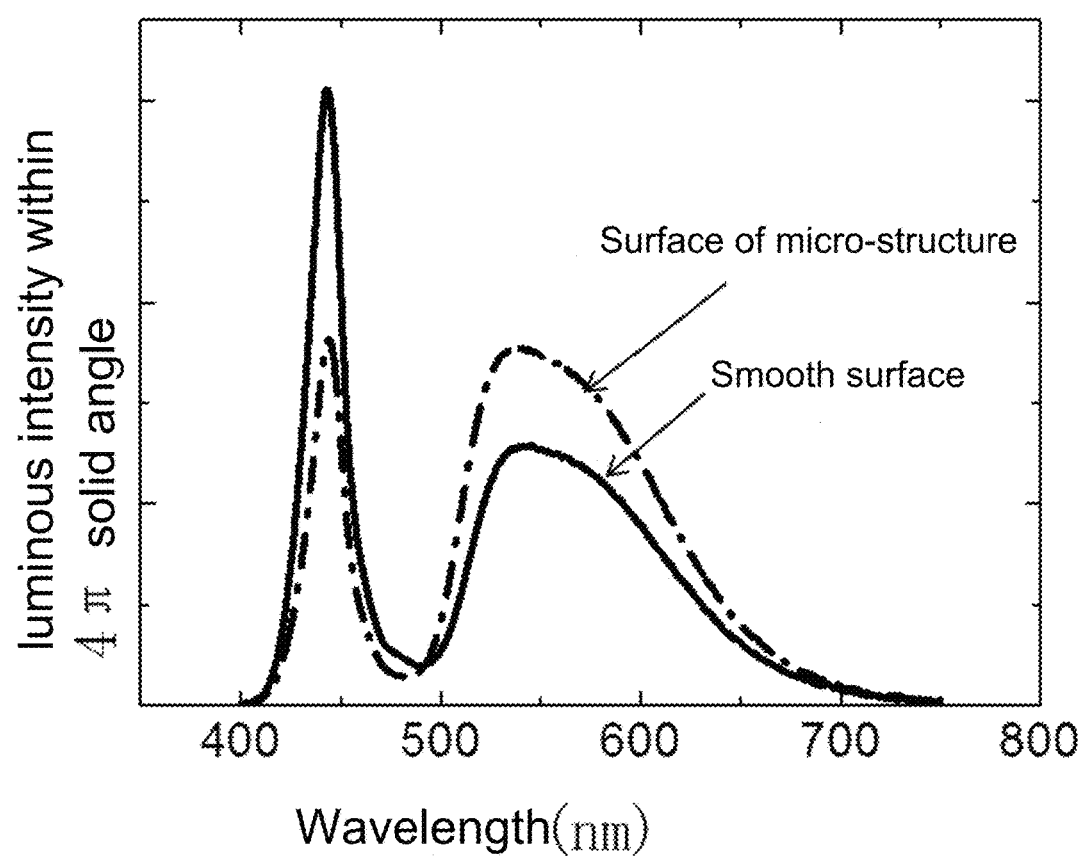
FIG. 4 is a comparison of the overall EL (Electroluminescence) within the 4π (solid angle of the covered white LED of the Ce:YAG phosphor crystal material with micro-structure arrays and the Ce:YAG phosphor crystal material with smooth surface measured by integrating sphere, which is excited by 250 mA blue LED chip. The peak wavelength of the blue LED is 445 nm.
Figure 5:
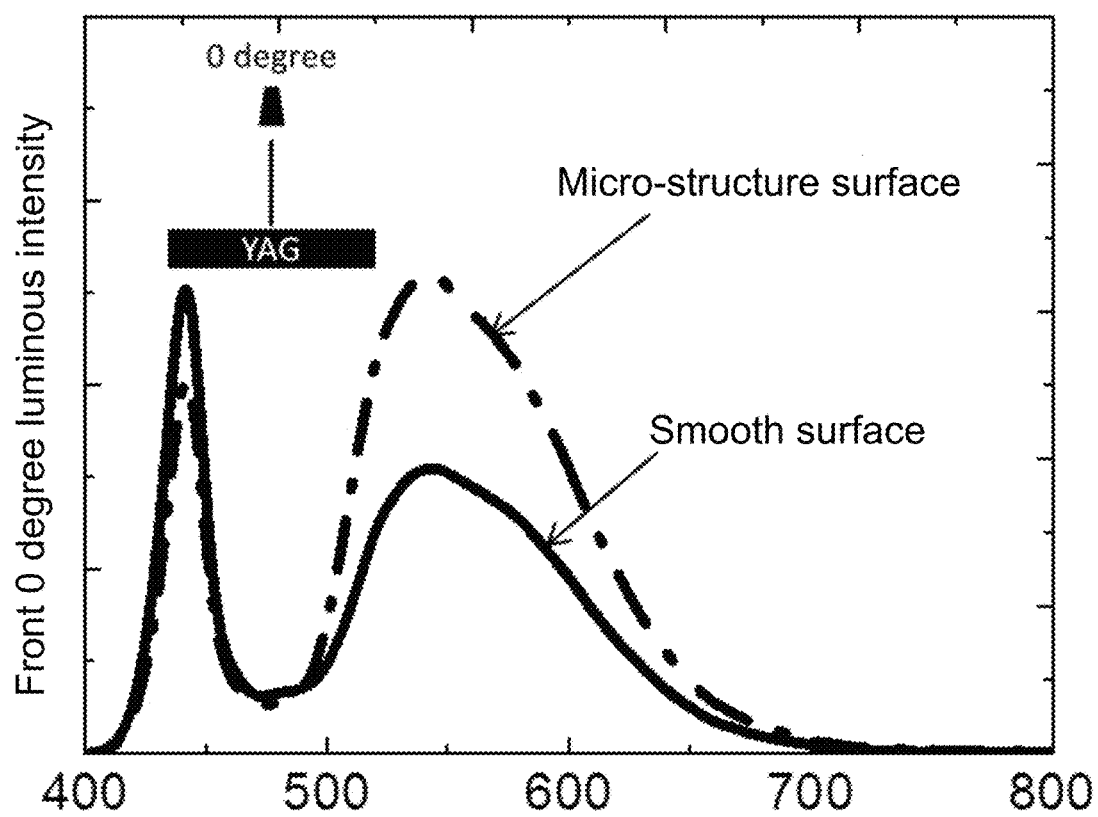
FIG. 5 is a comparison EL of the covered white LED of the Ce:YAG phosphor crystal material with micro-structure arrays and the Ce:YAG phosphor crystal material with smooth surface while the spectral detector lies in 0° (vertical to YAG surface) which is excited by 250 mA blue LED chip.
Figure 6:
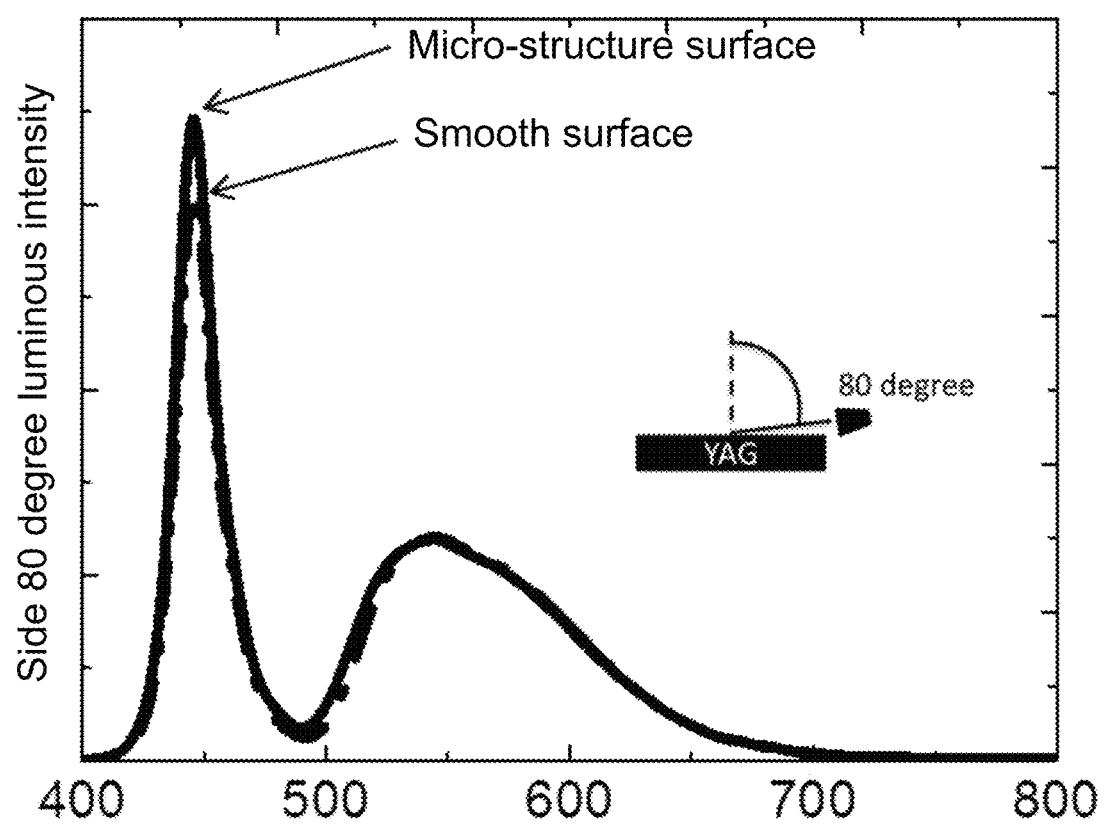
FIG. 6 is a comparison EL of the covered white LED of the Ce:YAG phosphor crystal material with micro-structure arrays and the Ce:YAG phosphor crystal material with smooth surface while the angle between spectral detector and the normal line is 80°.
Figure 7:
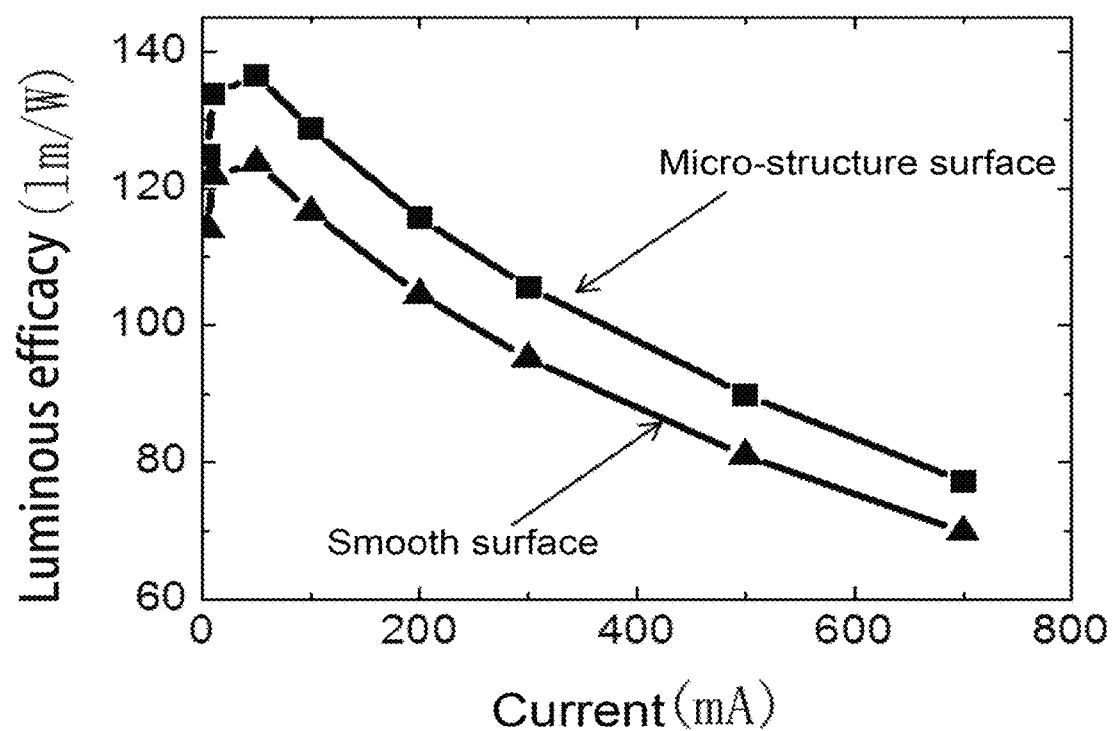
FIG. 7 is a comparison absolute values of the luminous efficacy of the covered white LED of the Ce:YAG phosphor crystal material with micro-structure arrays and the Ce:YAG phosphor crystal material with smooth surface

The process to make white LED using the patterned Ce:YAG phosphor crystal material comprises the following steps:

Step 1: Sets the blue LED chip 2 (the peak wavelength of the emission light is 440-460 nm) on the center of the encapsulation substrate and connect the electrode lead 3;

Step 2: Attaches the patterned Ce:YAG phosphor crystal material with micro-structure arrays onto the LED encapsulation substrate. The side with micro-structure arrays is facing up (the side without micro-structure arrays faces the LED chip) and get the remote phosphor converter structure white LED as illustrated in FIG. 3. Referred to FIG. 4, the present invention is able to significantly enhance the light extraction efficiency of the white LED (FIG. 3) and enhance the conversion ratio of blue photon to yellow photon. Referred to FIG. 5 and FIG. 6, the patterned Ce:YAG phosphor crystal material with micro-structure arrays mainly enhance the light emission intensity of the front (vertical to YAG surface) and on the side (angled with the normal line with big degrees) the emission intensity is increased slightly. The patterned phosphor crystal material altered the direction of light emission and increase the LED front/side light emission ratio. Referred to FIG. 7, the absolute value of the luminous efficacy of the covered white LED of the Ce:YAG phosphor crystal material with micro-structure arrays and the Ce:YAG phosphor crystal material with smooth surface increased about 15%.

Chart 1 is a comparison of the optical prosperities of a smooth surface phosphor crystal material and patterned phosphor crystal material under the current 350 mA measured by integrating sphere. Generally speaking the total luminous flux of the patterned phosphor crystal material processed with the present invention is enhanced and the blue-yellow light conversion ratio increased significantly.

CHART 1

|  | Smooth Ce:YAG phosphor crystal material | Patterned Ce:YAG phosphor crystal material | Patterned/ smooth |
| --- | --- | --- | --- |
| Luminous flux(lm) | 98.74 | 109.7 | 1.11 |
| Luminous efficacy lm/W | 91.65 | 105.42 | 1.15 |
| CIEx | 0.3406 | 0.3716 | 1.09 |
| CIEy | 0.3881 | 0.4661 | 1.20 |

Embodiment 2

Step 1: place the Ce:YAG phosphor single crystal material with a thickness of 0.3 mm ready for processing on the stage which is able to move freely along 2-dimensionally horizontal directions. The short-pulse laser focuses on one side of the phosphor crystal material through objective lens;

In step 1 the Ce:YAG phosphor material is double face polished. The absorption peak and the emission peak of the Ce:YAG phosphor material are 450 nm and 550 nm respectively; The doping concentration of the Ce in the Ce:YAG phosphor material is 0.03 at %; The pulse width, wavelength and repetition frequency of the short-pulse laser are 50 fs, 800 nm and 1 kHz respectively. The moving speed of the stage is 10 nm/s. The power of the short-pulse laser is 0.05 W and the laser spot focuses on the surface of the material (the diameter of the spot is 20 μm).

Step 2: Due to the special processing character of the laser, an ablation area is formed on the surface of the Ce:YAG phosphor crystal material around an area that takes the laser focus as the center that the peak energy of the generated pulse is especially high. The temperature on the focus rises rapidly and reaches the boiling point of the YAG material in a short time, which evaporate the material on the focus. The evaporated material is taken away by high speed high pressure gas sprayed by the nozzle and a hole is formed on the surface. The diameter of the single micro-structure is 5 μm and the depth is 2 μm. The surface of the hole is coarse and not smooth.

One skilled in the art will understand that the embodiment of the present invention as shown in the drawings and described above is exemplary only and not intended to be limiting. The micro-structure processed by laser is able to be arranged periodically which includes but not limited to micro-pits, micro-grooves, micro-lens, micro-holes. The micro-structure is also able to be arranged in aperiodicity.

While processing the micro-structure on one side of the phosphor crystal material, the side with micro-structure is facing the LED chip or the side without micro-structure is facing the LED chip in the LED encapsulation. The difference is that when the side with micro-structure is facing the LED chip the ratio of emitting light from the chip being reflected back by the phosphor crystal material is reduce and the light extraction efficiency of the phosphor crystal material is increased at the same time; when the side without micro-structure is facing the LED chip only the light extraction efficiency of the phosphor crystal material is increased; Processing micro-structure on both sides of the phosphor crystal material is a good choice, the micro-structure facing the LED chip is able to reduce the ratio of emitting light from the chip being reflected back and micro-structure on both sides is able to enhance the light extraction efficiency significantly.

What is claimed is:

1. A method for preparing an orderly patterned remote phosphor crystal material, comprising steps of:
   1) placing a remote phosphor crystal material ready for processing on a stage which is movable freely along 2-dimensionally horizontal directions, and focusing a short-pulse laser on a surface or above the surface of the remote phosphor crystal material ready for processing; and
   2) moving a stage which carries the remote phosphor crystal material and point-by-point scanning the surface of the remote phosphor crystal material with the short-pulse laser, which forms micro-structure arrays on the surface of the remote phosphor crystal material; a shape, a size and a spacing of a single structure in the micro-structure arrays is combinedly controlled by a power of a pulsed laser, repetition frequency of the pulse laser, a spacing between a laser focal plane and the surface of the material and a moving speed of the stage;
   wherein the orderly patterned remote phosphor crystal material comprises: a remote phosphor crystal material body, the orderly patterned micro-structure arrays on the surface of the remote phosphor crystal material body, which are produced by laser ablation.

2. The method for making the orderly patterned remote phosphor crystal material, as recited in claim 1, wherein a pulse-width of the short-pulse laser is 20 fs-100 ns; a wavelength is 355 nm-800 nm, a repetition frequency is 10 Hz-170 kHz; a power is 0.001 W-0.5 W; a laser energy density threshold is 30 J/cm$^2$-50 J/cm$^2$; a moving speed of the stage is 1 mm/s-100 mm/s.

3. The method for making the orderly patterned remote phosphor crystal material, as recited in claim 1, further comprising a step of: after finishing the step 2), dipping the remote phosphor crystal material with the micro-structure arrays on the surface into a mixed acid of concentrated sulfuric acid and hydrogen peroxide, or into concentrated sulfuric acid to remove debris generated by laser ablation; wherein a volume ratio of the concentrated sulfuric acid and the hydrogen peroxide is 3:1-7:1.

4. The method for making the orderly patterned remote phosphor crystal material, as recited in claim 1, wherein the remote phosphor crystal material ready for processing is made of $Y_3Al_5O_{12}$:Ce with a thickness of 0.1 mm-5 mm; a pulse width of the short-pulse laser is 1 ns-100 ns; a wavelength is 300 nm-400 nm; a repetition frequency is 1 kHz-30 kHz; a power is 0.01 W-0.5 W; a diameter of focused spot is 20 μm; a moving speed of the stage is 1 mm/s-100 mm/s.

5. The method for making the orderly patterned remote phosphor crystal material, as recited in claim 4, wherein an absorption peak of the phosphor crystal material of $Y_3Al_5O_{12}$:Ce is 420-460 nm; an emission peak is 510-570 nm; a doping concentration of $Ce^{3+}$ in $Y_3Al_5O_{12}$:C is 0.01-1 at %.

* * * * *